United States Patent [19]
Lee et al.

[11] Patent Number: 6,157,263
[45] Date of Patent: Dec. 5, 2000

[54] HIGH-SPEED AND HIGH-PRECISION PHASE LOCKED LOOP HAVING PHASE DETECTOR WITH DYNAMIC LOGIC STRUCTURE

[75] Inventors: Kyeongho Lee, Seoul; Deog-kyoon Jeong, Kyungki-do, both of Rep. of Korea

[73] Assignee: Silicon Image, Inc., Sunnyvale, Calif.

[21] Appl. No.: 09/098,266

[22] Filed: Jun. 16, 1998

Related U.S. Application Data

[63] Continuation of application No. 08/631,420, Apr. 12, 1996, Pat. No. 5,815,041.

[51] Int. Cl.$^7$ .................................................. H03L 7/00
[52] U.S. Cl. .................................................. 331/25; 331/8
[58] Field of Search .................................. 331/25, 1 A, 8, 331/17

[56] References Cited

U.S. PATENT DOCUMENTS

| | | | |
|---|---|---|---|
| 5,317,283 | 5/1994 | Korhonen | 331/1 A |
| 5,373,255 | 12/1994 | Bray et al. | 331/1 A |
| 5,896,066 | 4/1999 | Katayama et al. | 331/17 |

*Primary Examiner*—Robert Pascal
*Assistant Examiner*—Henry Choe
*Attorney, Agent, or Firm*—Fenwick & West LLP

[57] ABSTRACT

A phase lock loop includes a charge pump, a voltage controlled oscillator (VCO), and a phase frequency detector. The phase frequency detector has a dynamic logic structure. The phase frequency detector generates up and down signals for directing the charge pump to provide a voltage signal to the VCO to vary the frequency of the VCO clock. The difference between the up and down signals is indicative of the phase difference between the reference clock signal and the VCO clock. The phase frequency detector includes up and down signal generators for generating the up and down signals, respectively. The up signal generator includes a first p field effect transistor (FET) having a gate for receiving a set signal, a second p FET having a source coupled to the drain of the first p FET and having a gate for receiving a reference clock signal. A first n FET has a source coupled to the drain of the second p FET and has a gate for receiving the set signal. A third p FET has a gate coupled to the drain of the second p FET. A second n FET has a source coupled to the drain of the third p FET for providing the up signal, and has a gate for receiving the reference clock signal. A third n FET has a source coupled to the drain of the second n FET and has a gate coupled to the gate of the third p FET. The down signal generator includes a fourth p FET having a gate for receiving the set signal. A fifth p FET has a source coupled to the drain of the fourth p FET and has a gate for receiving a VCO clock signal. A fourth n FET has a source coupled to the drain of the fifth n FET and has a gate for receiving the set signal. A sixth p FET has a gate coupled to the drain of the fifth p FET. A fifth n FET has a source coupled to the drain of the sixth p FET and has a gate for receiving the VCO clock signal. A sixth n FET has a source coupled to the drain of the fifth n FET for providing the down signal, and has a gate coupled to the gate of the sixth p FET. A reset circuit, such as a NAND gate, has a first input coupled to the drain of the third p FET, has a second input coupled to the drain of the sixth p FET, and has an output for generating the set signal.

2 Claims, 11 Drawing Sheets

HIGH-SPEED AND HIGH-PRECISION PHASE LOCKED LOOP HAVING PHASE DETECTOR WITH DYNAMIC LOGIC STRUCTURE

Cross Reference to Related Applications

This is a continuation of application Ser. No. 08/631,420 filed on Apr. 12, 1996, now U.S. Pat. No. 5,815,941 which is incorporated by reference herein in its entirety.

FIELD OF THE INVENTION

This invention relates to phase-lock loop circuits, and more particularly to high speed and high-precision phase frequency detectors.

BACKGROUND OF THE INVENTION

Phase lock loops (PLL) typically include a phase frequency detector (PFD) that provides control signals indicative of a phase difference between a reference clock and an oscillation signal or a VCO clock of a voltage controlled oscillator (VCO). A charge pump provides a voltage signal to the VCO in response to the control signals. The VCO provides the oscillation signal responsive to the voltage signal.

As the frequency of the reference clock is increased, the performance requirements of the phase lock loop becomes more stringent. A high performance PLL has low clock jitter at its operation frequency. The PLL jitter is caused by two major factors. First, the supply noise can abruptly change the frequency of the VCO and result in PLL clock output jitter. This type of jitter can be reduced by increasing the noise immunity of the VCO circuitry. The second major factor is the precision of the phase frequency detector. A low precision of phase frequency detector typically has a large minimum detectable phase difference (or "dead zone"), which increases the jitter. The jitter caused by the low precision phase frequency detector can be reduced by increasing the precision of the phase frequency detector. A phase frequency detector including a conventional static logic gate structure has a speed limitation due to the propagation delay through multiple logic gate stages. This speed limitation increases the dead zone in the operation of the phase frequency detector at high frequency, and hence increases the jitter.

It is desirable to have a PLL that operates at higher frequencies with less jitter.

SUMMARY OF THE INVENTION

The present invention provides a phase lock loop that includes a dynamic phase frequency detector that includes dynamic logic, instead of static logic, to decrease the propagation delay through the detector.

The dynamic phase frequency detector increases the maximum operating frequency of the PLL with higher precision and less jitter at the PLL output clock. The dynamic phase frequency detector is simpler. The number of transistors and the layout area is reduced for an efficient implementation. As a result, the conventional static phase frequency detector is replaced by the dynamic phase frequency detector for high precision and low jitter operation of PLL.

DETAILED DESCRIPTION OF THE PREFERRED EMBODIMENT

Figure 1:
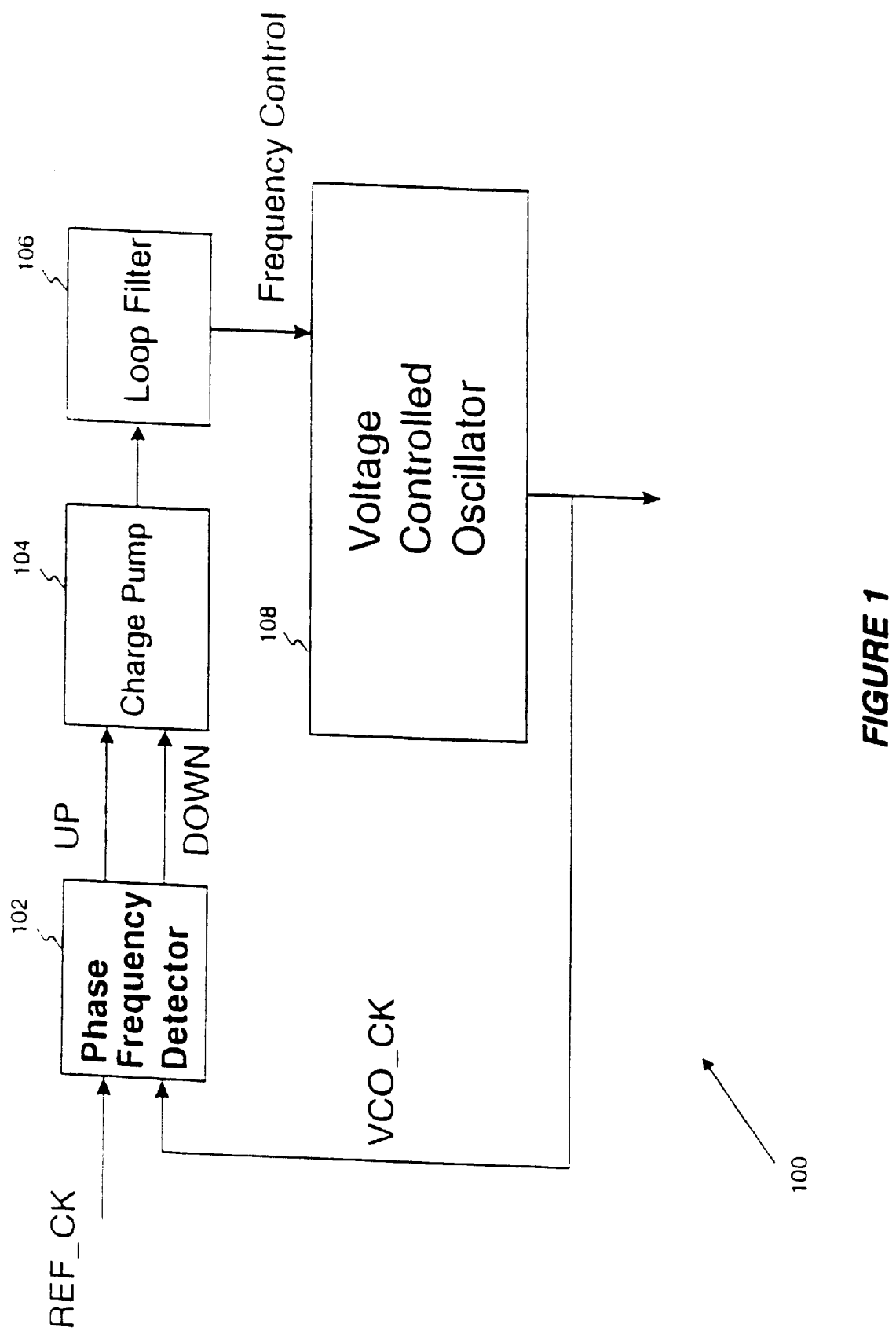
FIG. 1 is a block diagram illustrating a phase lock loop circuit.

Referring to FIG. 1, there is shown a block diagram illustrating a phase lock loop (PLL) circuit 100, which includes a phase frequency detector 102, a charge pump 104, a loop filter 106, and a voltage controlled oscillator (VCO) 108. A reference clock signal and a VCO clock signal from the VCO 108 are applied to respective input terminals of the phase frequency detector 102. The phase frequency detector 102 compares the phase of the reference clock signal and the VCO clock signal and provides an up signal and a down signal to respective input terminals of the charge pump 104. The up and down signals indicate respective positive and negative charge directions for the charge pump 104 to provide a voltage control signal to the VCO 108 for varying the frequency of the oscillation signal or VCO clock signal from the VCO 108.

The phase frequency detector 102 generates the phase difference between the up and down signals to be substantially equal to the phase difference between the reference clock signal and the VCO clock signal. In particular, the phase difference of the reference clock signal and the VCO clock signal is copied and realized by the difference in the durations of the up and down signals. When the VCO clock signal is slower than the reference clock signal, the duration of the up signal is larger than the duration of the down signal to thereby increase the frequency of the VCO clock signal.

When the VCO clock signal is faster than the reference clock signal, the duration of the down signal is larger than the duration of the up signal to thereby decrease the frequency of the VCO clock signal.

Figure 2:
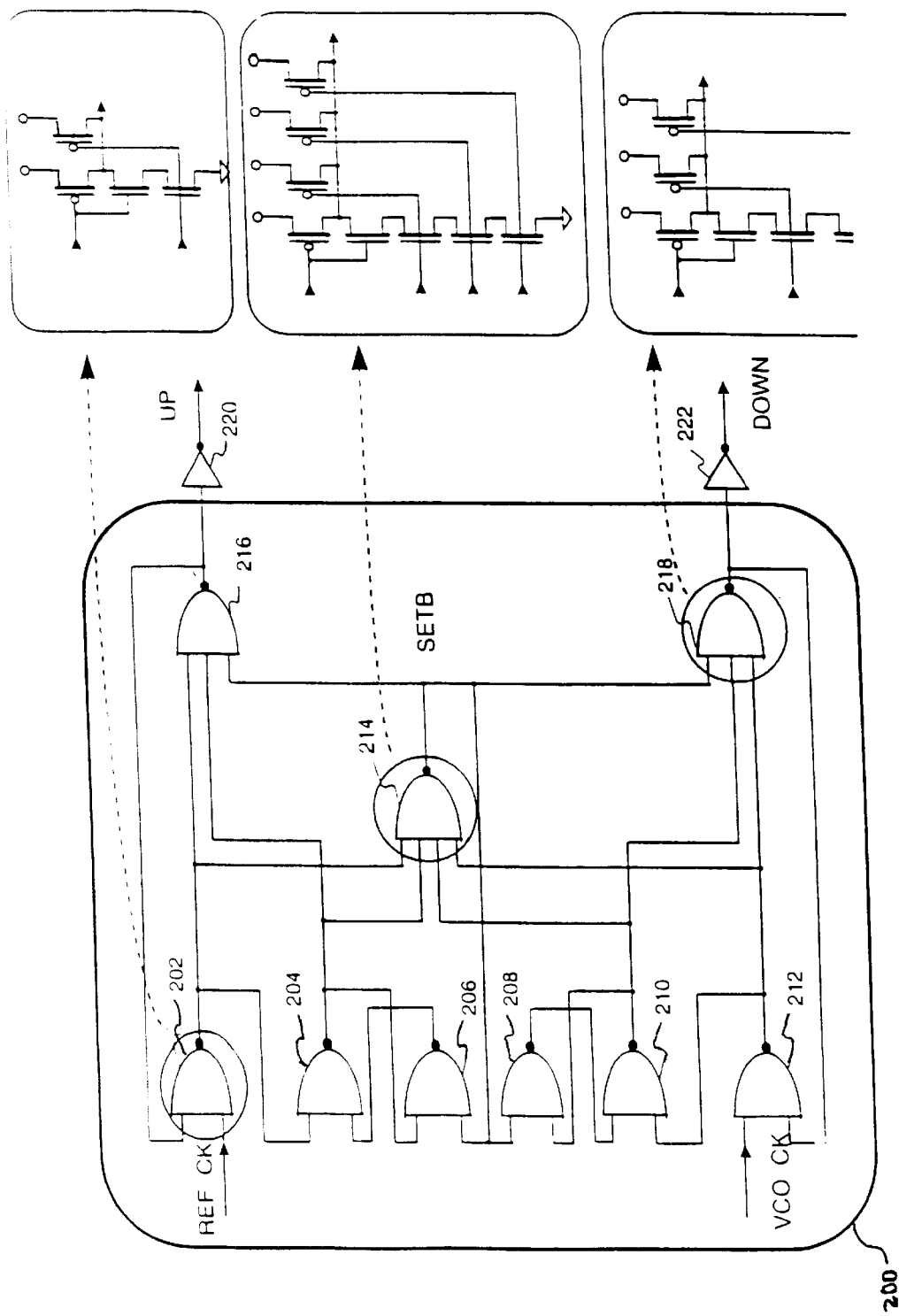
FIG. 2 is a block diagram illustrating a conventional static phase frequency detector.

Referring to FIG. 2, there is shown a block diagram illustrating a conventional static phase shift detector 200, which includes NAND gates 202, 204, 206, 208, 210, 212, 214, 216, and 218, and inverters 220 and 222. Schematic diagrams of two, three, and four input NAND gates are shown to illustrate the Field Effect Transistor (FET) implementation of such NAND gates. In such an implementation, the static phase shift detector 200 includes 44 transistors.

Referring to FIGS. 3a–3e, there are shown timing diagrams illustrating the operation of the conventional static phase frequency detector 200 when the VCO clock signal is slower than the reference clock signal. Referring now to FIGS. 3a and 3e, there are shown the timing diagrams of the reference clock signal and the up signal, respectively. At a time $t_0$, in response to a leading edge of the reference clock signal, the NAND gates 202, 216, and the inverter 220 generate the up signal. Referring now to FIGS. 3b and 3e, there are shown timing diagrams of the VCO clock signal and the down signal, respectively. At a time $t_1$, in response to a leading edge of the VCO clock signal, the NAND gates 212, 218, and the inverter 222 generate the down signal. The difference between times $t_0$ and $t_1$ is the phase difference between the up and down signals. Referring now to FIG. 3c, there is shown a timing diagram of a set signal. In response to the reference clock, the NAND gate 202 resets the NAND gates 204 and 206 which are configured as a static RS flip-flop. In response to the VCO clock, the NAND gate 218 changes the state of the NAND gate 212 to thereby reset the NAND gates 208 and 210 which are configured as a static RS flip-flop. This causes the NAND gate 214 to provide a set B signal to the NAND gates 216 and 218 to reset these NAND gates and disable the up and down signals. This timing is repeated for each subsequent pulse of the reference clock and of the VCO clock.

Referring to FIGS. 4a–4e, there are shown timing diagrams of the reference clock signal, the VCO clock signal, the set signal, the up signal, and the down signal, respectively, when the VCO clock signal is faster than the reference clock signal. In contrast to the timing shown in FIGS. 3a–3e, the leading edge of the VCO clock signal occurs at time to before the leading edge of the reference clock signal which occurs at time $t_1$. Thus the down signal becomes active before the up signal. Here, upon the occurrence of the leading edge of the reference clock, the NAND gate 214 provides the set B signal to the NAND gates 216 and 218 to disable the up and down signals. This timing is repeated for each subsequent pulse of the reference clock and the VCO clock.

Figure 3:
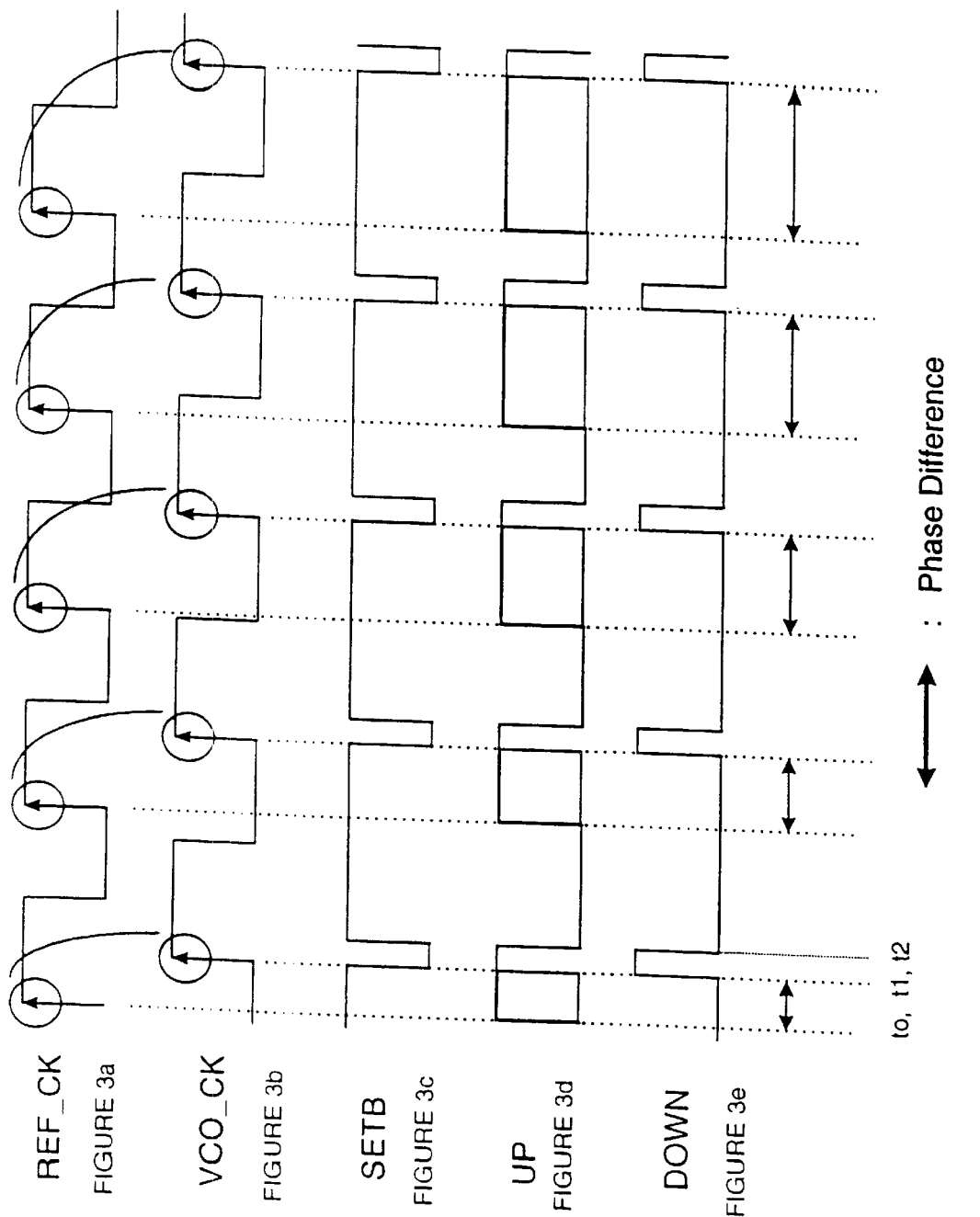
FIGS. 3a–3e are timing diagrams illustrating the operation of the conventional static phase frequency detector of FIG. 2, when the VCO clock signal is slower than the reference clock signal.
Figure 4:
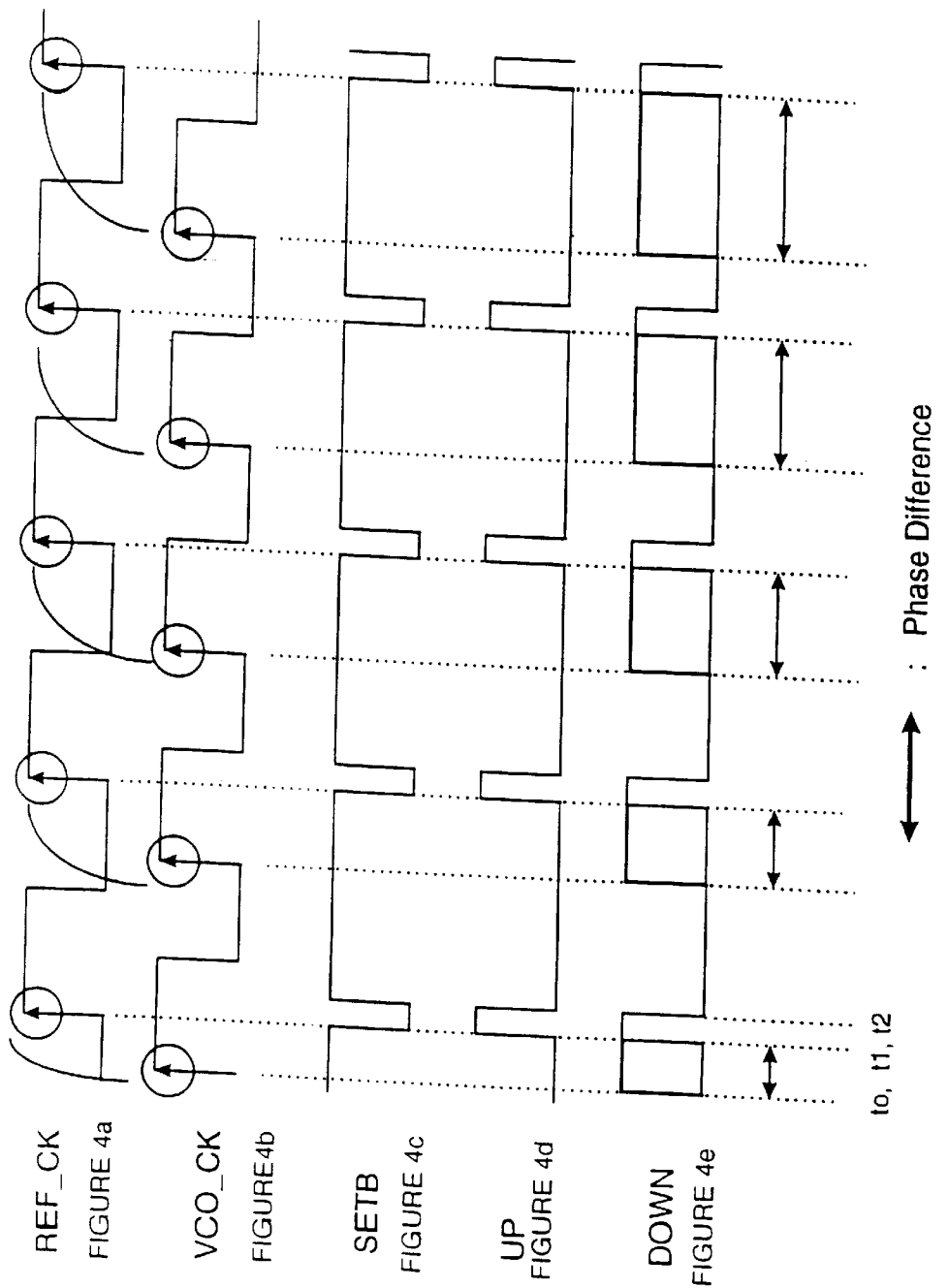
FIGS. 4a–4e are timing diagrams illustrating the operation of the conventional static phase frequency detector of FIG. 2 when the VCO clock signal is faster than the reference clock signal.

As shown in FIG. 3, when the VCO clock is slower than the reference clock, the duration of the up signal is larger than the duration of the down signal, and the difference of the durations is the phase difference.

Figure 5:
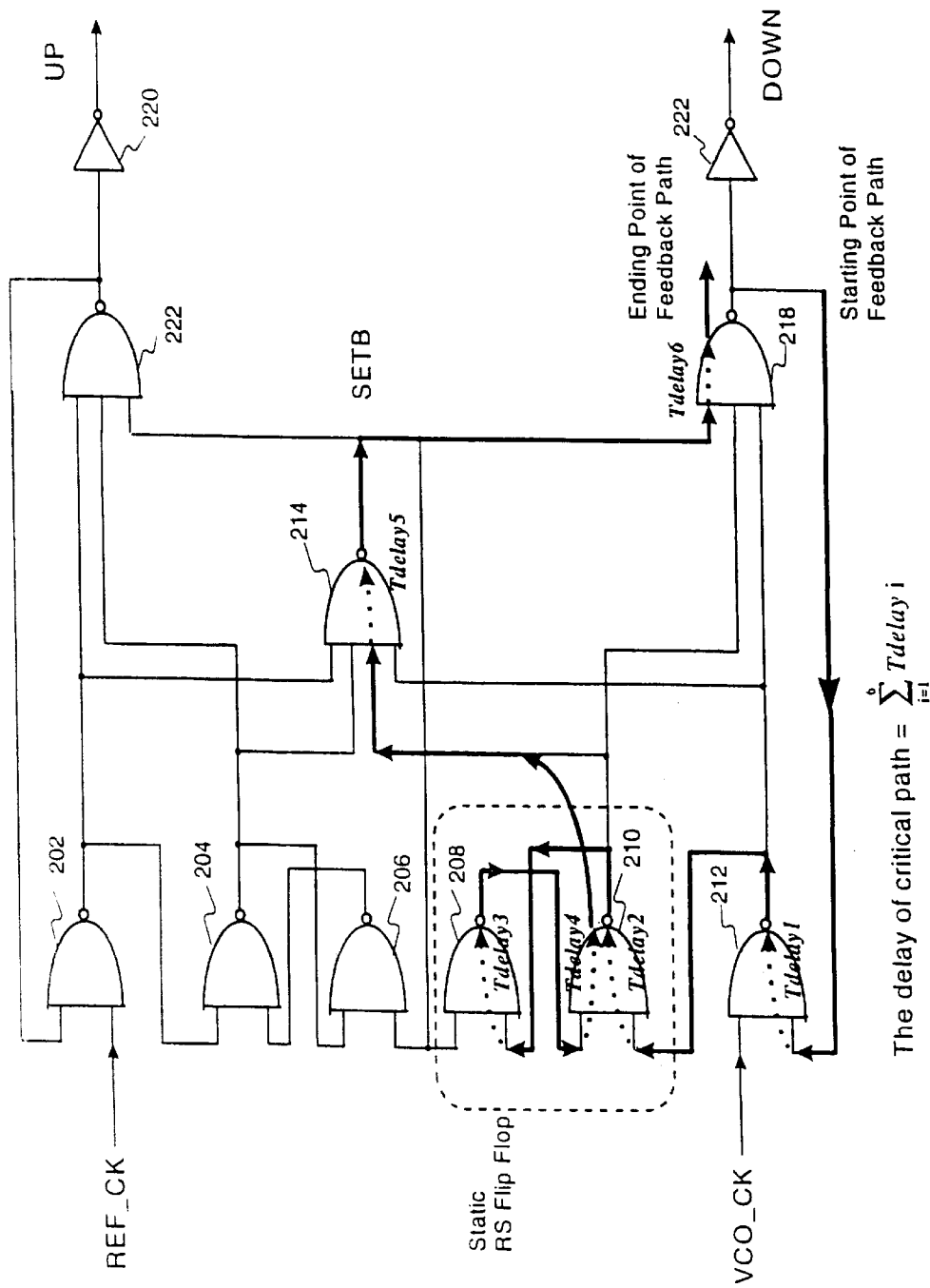
FIG. 5 is a schematic diagram illustrating the critical timing path of the conventional static phase frequency detector.

Referring to FIG. 5, there is shown a schematic diagram illustrating the critical timing path of the static phase frequency detector 200. The static phase frequency detector 200 is a state machine. Before moving to another state from the current state, all internal nodes of the static phase frequency detector 200 must be set to either a high state or a low state. Accordingly, the delay time for setting all internal nodes to either state determines the overall speed of the detector 200. The critical path of the static phase frequency detector 202 determines the maximum delay time to set all nodes to either a high state or a low state.

The critical timing path of the static phase frequency detector 200 is the feedback path compressing the NAND gates 212, 210, 208, 214, and 218. Because of the cross coupling between the NAND gates 208 and 210, the critical path is a six gate delay. As a result, the 6 gate delay determines the overall speed of conventional static phase frequency detector 200.

Figure 6:
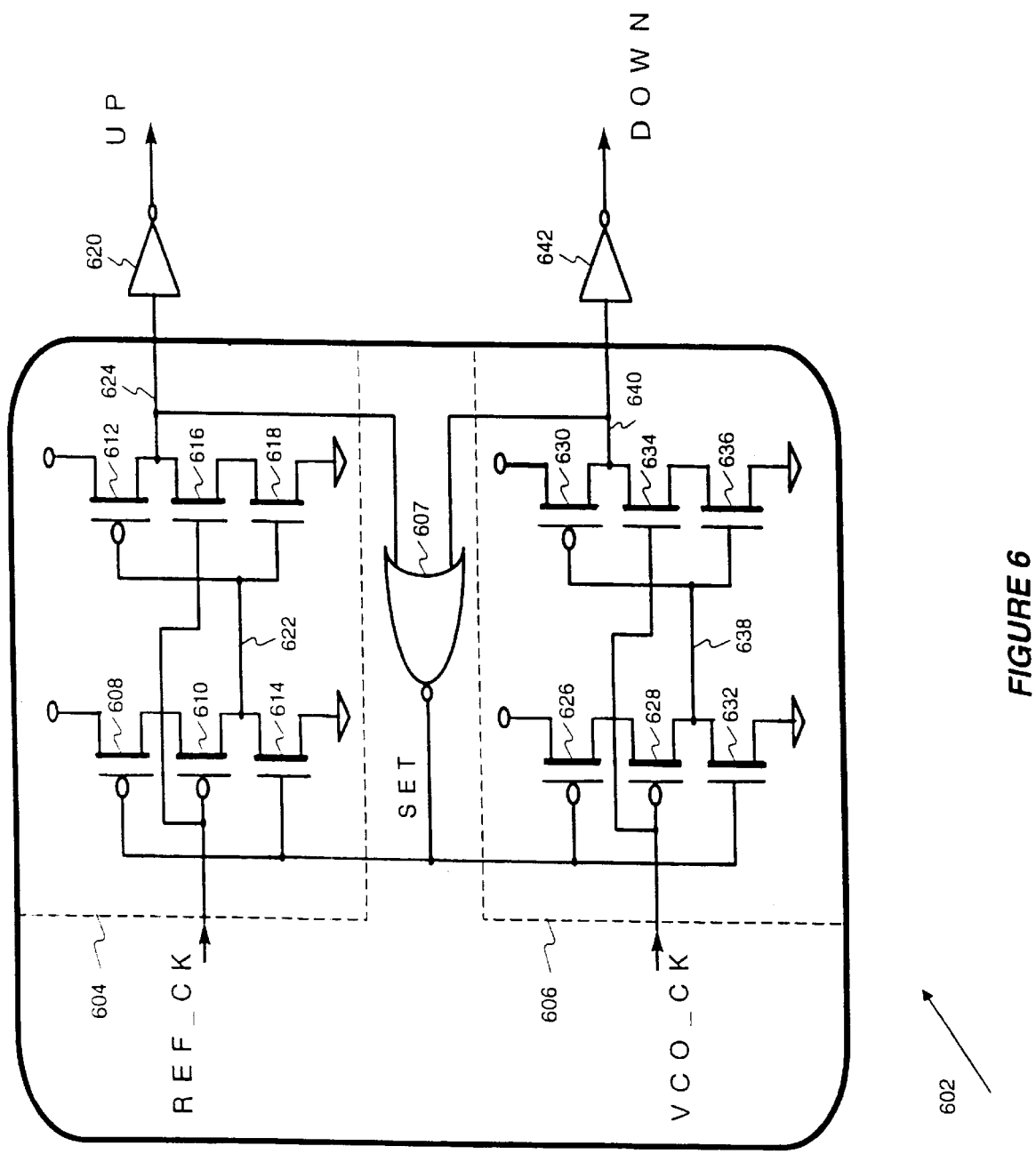
FIG. 6 is a schematic diagram illustrating a dynamic phase frequency detector in accordance with the present invention.

Referring to FIG. 6, there is shown a schematic diagram illustrating a dynamic phase frequency detector 602 in accordance with the present invention. The phase frequency detector 602 includes an up signal generator 604, a down signal generator 606, and a reset circuit 607. The up signal generator provides an up signal to the charge pump 104 in response to a reference clock. Likewise, the down signal generator 606 provides a down signal to the charge pump 104 in response to a VCO clock signal from the voltage controlled oscillator 108. The reset circuit 607 resets both the up signal generator 604 and the down signal generator 606 a predetermined time after the occurrence of the leading edges of both the reference clock and the VCO clock.

The up signal generator 604 includes p FETS 608, 610, and 612, n FETS 614, 616, and 618, and an inverter 620. The drain-source junction of the p FET 608 couples the source of the p FET transistor 610 to an external power source (not shown). The drain-source junction of the n FET 614 couples the common node of the drain of the p FET transistor 610 and the signal line 622 to a ground line. A set signal from the reset circuit 607 is applied to the gates of the p FET 608 and the n FET 614. The reference clock is applied to the gate of the p FET 610. The drain-source junction of the p FET transistor 612 couples the common node of the source terminal of the n FET 616 and a signal line 624 to the external power source. The drain-source junction of the n FET 618 couples the drain terminal of the n FET 616 to the ground line. The reference clock is applied to the gate of the n FET 616. The signal line 622 is applied to the common node of the gates of the p FET 612 and the n FET 618. The inverter 620 provides the up signal in response to the signal on the signal line 624.

The down signal generator 606 includes p FETS 626, 628, and 630, n FETS 632, 634, and 636 and an inverter 642. The drain-source junction of the p FET 626 couples the source of the p FET transistor 628 to an external power source (not shown). The drain-source junction of the n FET 632 couples the common node of the drain of the p FET transistor 628 and a signal line 638 to a ground line. A set signal from the reset circuit 607 is applied to the common node of the gates of the p FET 626 and the n FET 632. The VCO clock is applied to the gate of the p FET 628. The drain-source junction of the p FET transistor 630 couples the common node of the source terminal of the n FET 634 and a signal line 640 to the external power source. The drain-source junction of the n FET 636 couples the drain terminal of the n FET 634 to the ground line. The VCO clock is applied to the gate of the n FET 634. The signal line 638 is applied to the gates of the p FET 630 and the n FET 636. The inverter 642 provides the down signal in response to the signal on the signal line 640.

As implemented, the dynamic phase frequency detector 602 uses dynamic logic which includes 16 transistors. In contrast, the static logic of the static phase frequency detector 200 includes 44 transistors. By using less transistors, the dynamic phase frequency detector 602 requires less implementation area than the static phase frequency detector 200.

Referring to FIGS. 7a–7e, there are shown timing diagrams illustrating the operation of the dynamic phase frequency detector 602, when the VCO clock signal is slower than the reference clock signal. Referring now to FIGS. 7a and 7e, there are shown the timing diagrams of the reference clock signal and the up signal, respectively. At a time $t_0$, in response to a leading edge of the reference clock signal, the up signal generator 604 generates the up signal. Referring now to FIGS. 7b and 7e, there are shown timing diagrams of the VCO clock signal and the down signal, respectively. At a time $t_1$, in response to a leading edge of the VCO clock signal, the down signal generator 606 generates the down signal. Referring now to FIG. 7c, there is shown a timing diagram of a set signal. The signals on the signal lines 624 and 640 both provide low signals to the reset circuit 607, which provides a set signal to both the up signal generator 604 and the down signal generator 606. The set signal remains high until the set signal propagates through the generators 604 and 606. The signal on the signal lines 624 and 640 goes high to thereby drive the up signal, the down signal, and the set signal low at a time $t_2$. This timing is repeated for each subsequent pulse of the reference clock and the VCO clock.

Referring to FIGS. 8a–8e, there are shown timing diagrams of the reference clock signal, the VCO clock signal, the set signal, the up signal, and the down signal, respectively, when the VCO clock signal is faster than the reference clock signal. In contrast to the timing shown in FIGS. 7a–7e, the leading edge of the VCO clock signal occurs at time to before the leading edge of the reference clock signal. Thus the down signal becomes active before the up signal. Here, upon the occurrence of the leading edge of the reference clock, both signals on the signal lines 624 and 640 each provide a low signal to the reset circuit 607 to thereby provide the set signal to the up and down signal generators 604 and 606, respectively. After the set signal propagates through the generators 604 and 606, the generators 604 and 606 turn off the up and down signals, respectively. This timing is repeated for each subsequent pulse of the reference clock and the VCO clock.

Figure 7:
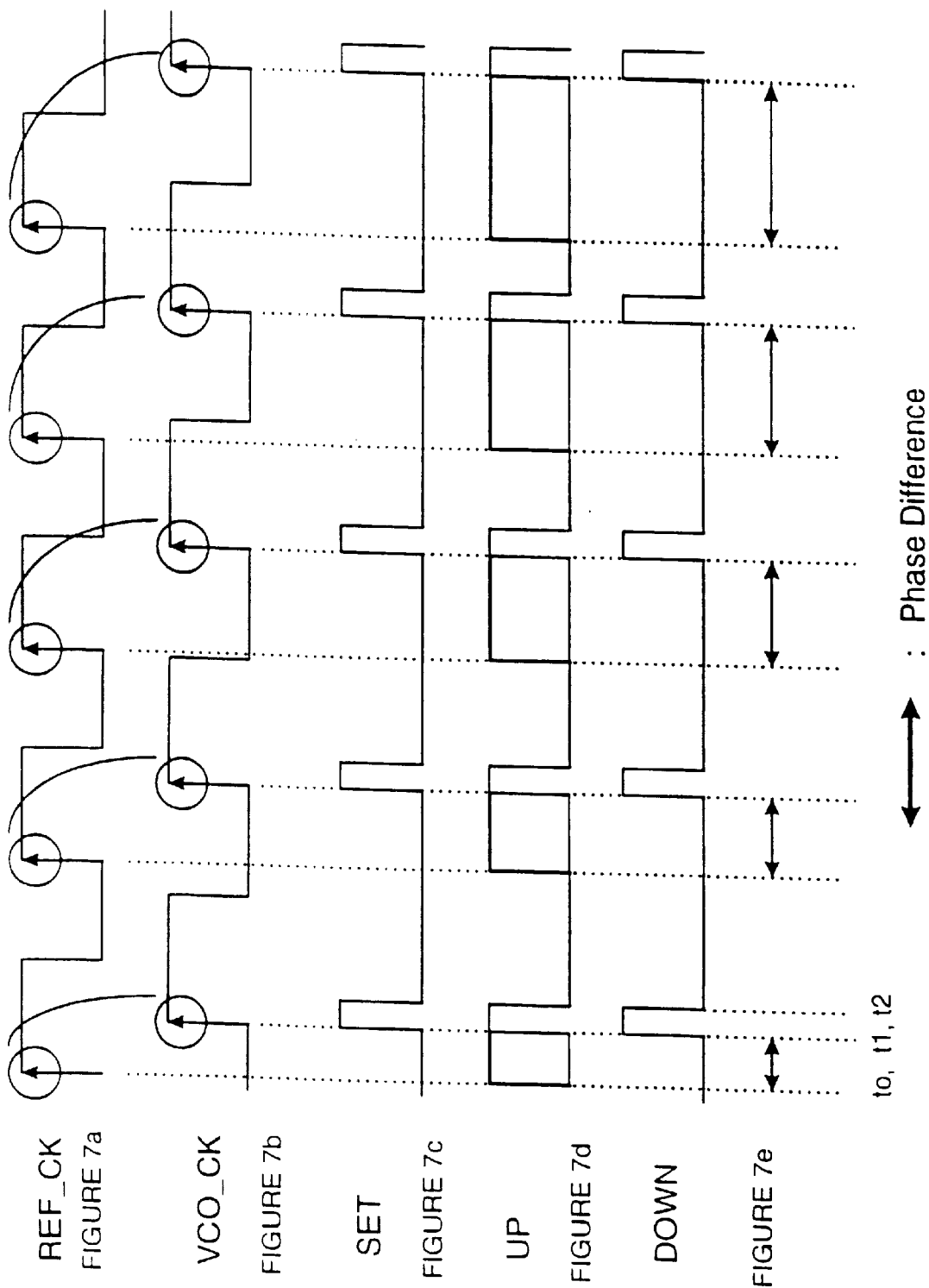
FIGS. 7a–7e are timing diagrams illustrating the operation of the dynamic phase frequency detector of FIG. 6, when the VCO clock signal is slower than the reference clock signal.
Figure 8:
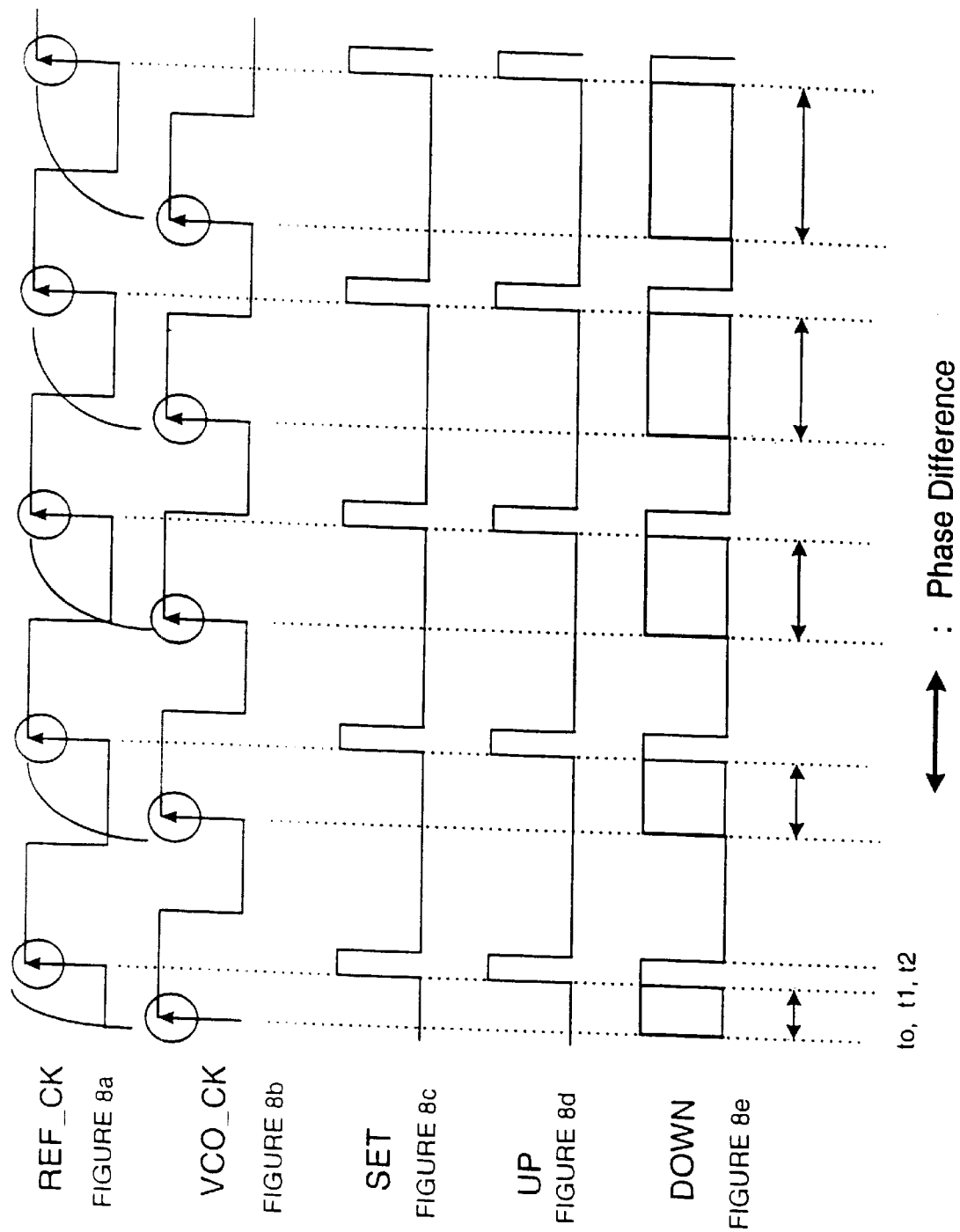
FIGS. 8a–8e are timing diagrams illustrating the operation of the dynamic phase frequency detector of FIG. 6 when the VCO clock signal is faster than the reference clock signal.

As shown in FIG. 7 and FIG. 8, the functionality of the dynamic phase frequency detector 602 is substantially identical to that of conventional static phase frequency detector 200.

Figure 9:
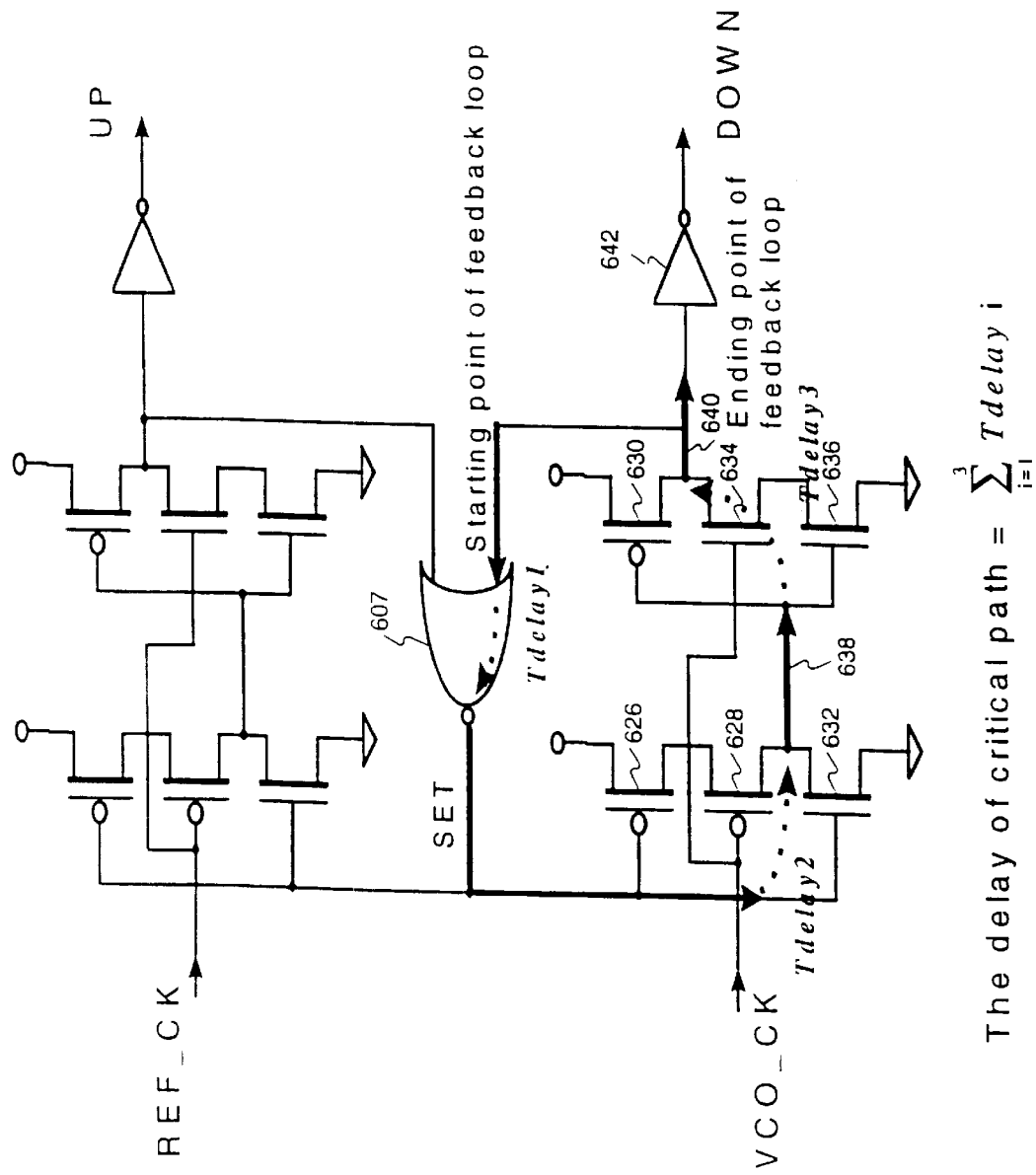
FIG. 9 is a schematic diagram illustrating the critical timing path of the dynamic phase frequency detector of FIG. 6.

Referring to FIG. 9, there is shown a schematic diagram illustrating the critical timing path of the dynamic phase frequency detector 602. The critical timing path of the dynamic phase frequency detector 602 is the feedback path comprising the reset circuit 607, the p FET 628, and the n FET 634.

Assuming that each gate delay is identical, the operating frequency of the dynamic phase frequency detector 602 can be twice of that of conventional static phase frequency detector 200 because, as previously mentioned, the critical path of the conventional static phase frequency detector 200 is a six gate feedback path.

Figure 10:
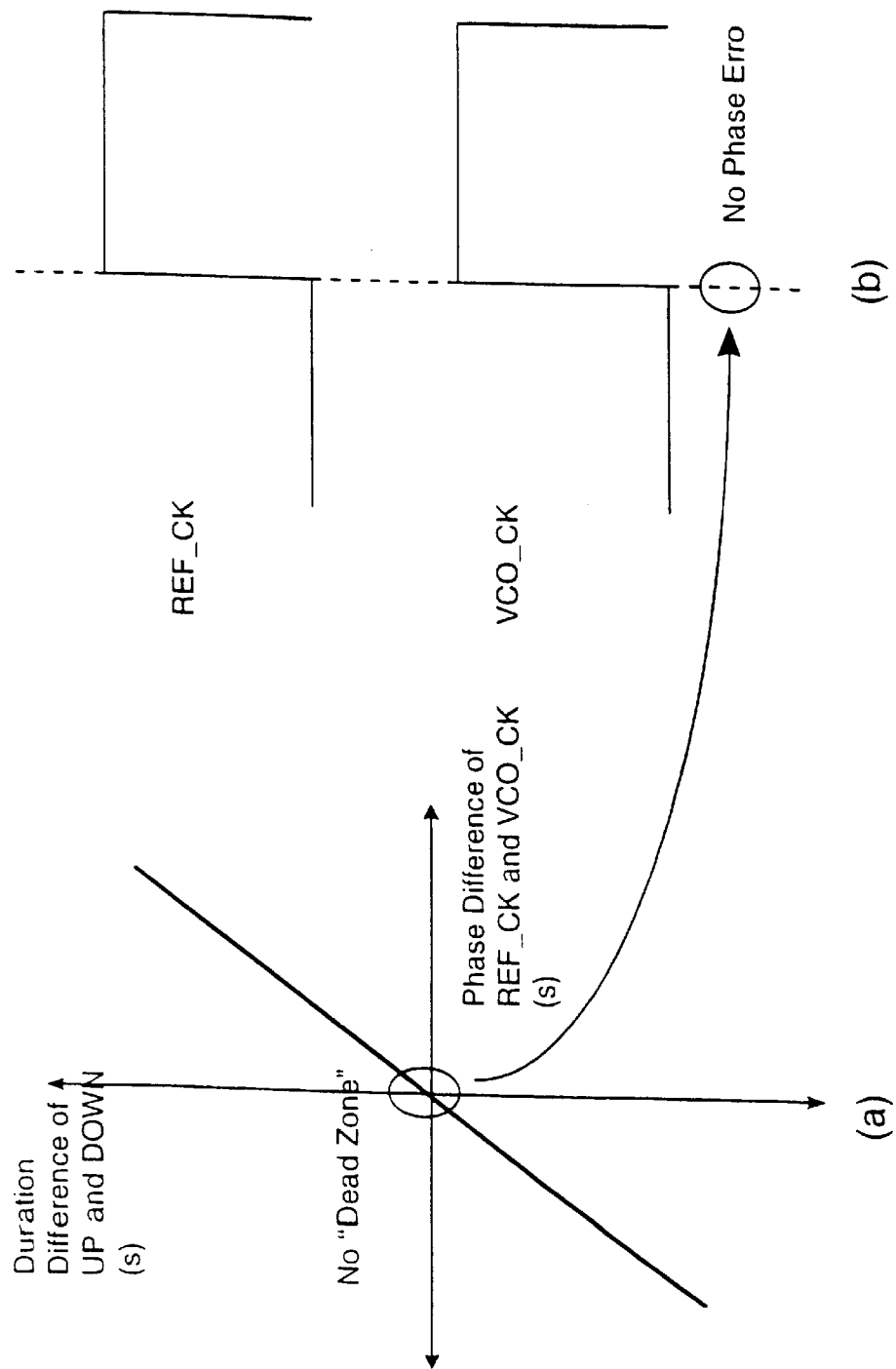
FIG. 10(a) is a graph illustrating the ideal phase difference characteristics of an ideal phase frequency detector.
FIG. 10(b) is a timing diagram illustrating the timing relation between the reference clock and the VCO clock for an ideal phase frequency detector.

Referring to FIG. 10a, there is shown a graph illustrating the phase difference characteristics of an ideal phase frequency detector. Referring to FIG. 10b, there is shown the timing relation between the reference clock and the VCO clock of the ideal phase frequency detector.

As shown in FIG. 10a, an ideal phase frequency detector converts the phase difference between the reference clock signal and the VCO clock signal to the difference in the durations of the up and down signals, in an exact linear relationship to the phase difference over the entire range of the phase difference. In this case, the feed back loop of the phase lock loop operates linearly across the entire range of the phase difference. Consequently, the phase error of the reference clock signal and the VCO clock signal is reduced to zero by the ideal phase frequency detector and the overall feedback loop, as shown in FIG. 10b.

But a non-ideal phase frequency detector has a precision limit, caused by the limit of the operating frequency. If the operating frequency is higher than the operating frequency allowed by a phase frequency detector, the precision of the phase frequency detector is not predeterminable. This precision-limit results in the "dead zone" of the phase frequency detector, the smallest phase difference detectable by the phase frequency detector. Thus, a higher precision means a smaller dead zone.

Figure 11:
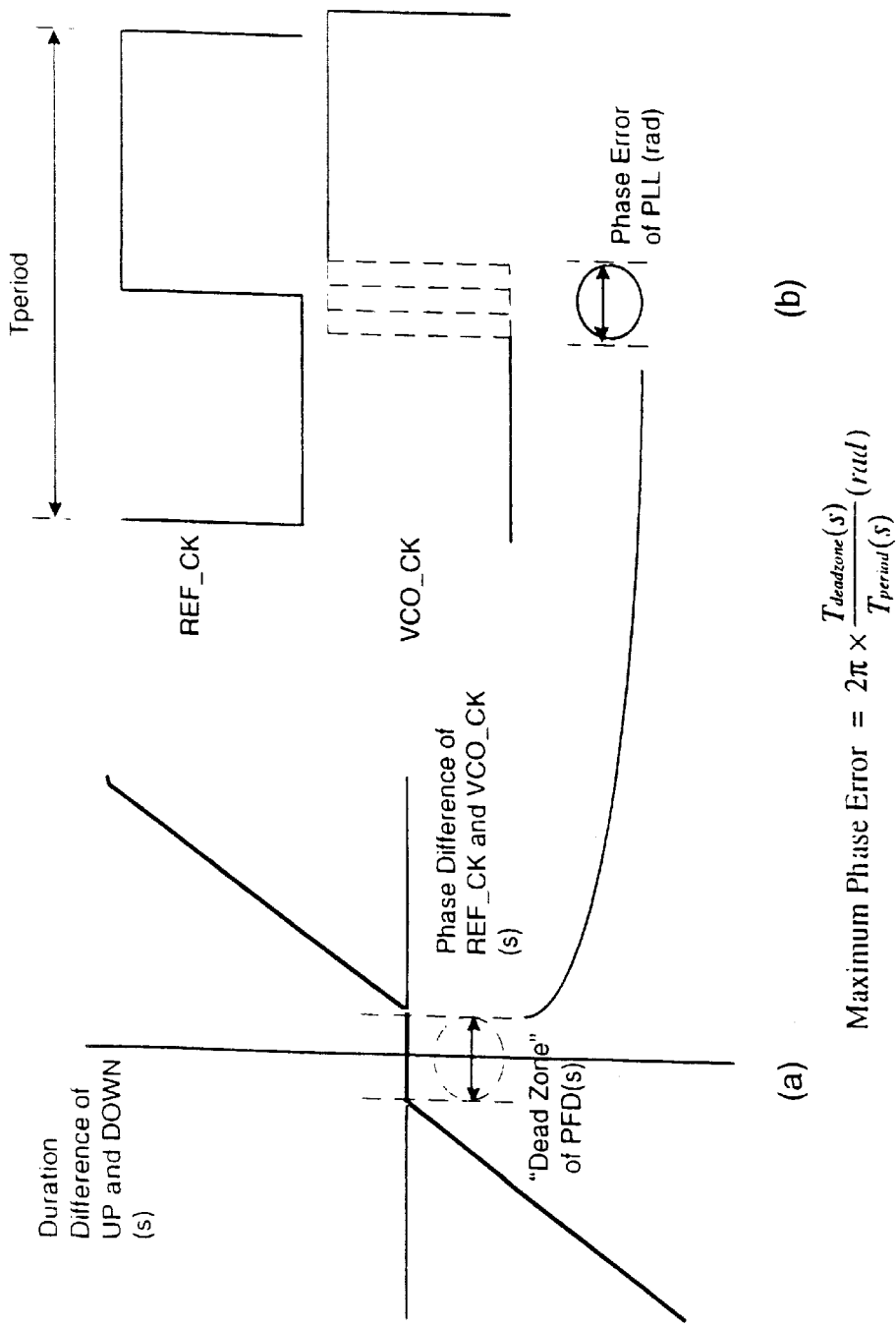
FIG. 11(a) is a graph illustrating the phase difference characteristics of a non-ideal phase frequency detector.
FIG. 11(b) is the timing relation between the reference clock and the VCO clock for the non-ideal phase frequency detector.

Referring to FIG. 11a, there is shown a graph illustrating the characteristics of a non-ideal phase frequency detector. Referring to FIG. 11b, there is shown the timing relation between the reference clock signal and the VCO clock signal for the non-ideal phase frequency detector.

As shown in FIG. 11a, a non-ideal phase frequency detector has a "dead zone". If the phase difference of the reference clock signal and the VCO clock signal is smaller than the "dead zone", the non-ideal phase frequency detector cannot detect the phase difference. So, the difference of the duration of the up and down signals is zero, even if there is a phase difference smaller than the "dead zone". As a result, the correct feed back operation of the PLL fails if the phase difference is smaller than the "dead zone". In this case, there exists an unavoidable phase error between the reference clock signal and the VCO clock signal, which is the jitter caused by a low precision of the phase frequency detector. As shown in FIG. 11b, the "dead zone" of the phase frequency detector is copied to the unavoidable phase error of the reference clock signal and the VCO clock signal. The relation between the "dead zone" and the maximum phase error is:

$$\text{Maximum Phase Error} = 2\pi \times \frac{T_{deadzone}}{T_{period}}. \qquad (1)$$

By reducing the dead zone of the phase frequency detector, the PLL jitter (unavoidable phase error between the reference clock and the VCO clock) is reduced. In the low frequency operation, a conventional phase frequency detector can do work with a reasonable dead zone. But as the operating frequency is increased, the phase error between the reference clock and the VCO clock is increased because the "dead zone" of the phase frequency detector is fixed and the period of the reference clock is reduced. Because the conventional phase frequency detector can not guarantee the high precision nor a small "dead zone" in the higher frequency operation than allowed by its frequency limitation. The dynamic phase frequency detector of the present invention, increases the operating frequency to at least twice the operating frequency of a conventional phase frequency detector. The dynamic phase frequency detector may be used in the higher frequency applications because of the higher precision and smaller dead zone.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

We claim:

1. A phase lock loop for providing an oscillation signal in response to a reference clock signal comprising:

a charge pump having a first input for receiving an up signal, having a second input for receiving a down signal, and having an output for providing a voltage signal responsive to the up and down signals;

a voltage controlled oscillator having an input coupled to the output of the charge pump for providing the oscillation signal having a frequency responsive to the voltage signal; and a phase frequency detector comprising:
    a first individual dynamic dedicated logic circuit having a first input for receiving a reference clock signal and a first output for providing the up signal, and
    a second individual dynamic logic circuit having a second input for receiving the oscillation signal and a second output for providing the down signal, the difference between the up and down signals being indicative of the phase difference between the reference clock signal and the oscillation signal.

2. The phase lock loop of claim 13 wherein the phase frequency detector further comprises:
    a reset circuit having an output coupled to both the first and second dynamic logic circuits for providing a set signal to disable the up and down signals, respectively, in response to the later of the reference signal and the oscillation signal.

\* \* \* \* \*